(12) United States Patent
Cui

(10) Patent No.: US 12,035,561 B2
(45) Date of Patent: Jul. 9, 2024

(54) OLED DISPLAY PANEL INCLUDING LYOPHILIC AND LYOPHOBIC MODIFICATION STRIPES

(71) Applicant: BOE Technology Group Co., Ltd., Beijing (CN)

(72) Inventor: Ying Cui, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 298 days.

(21) Appl. No.: 17/511,307

(22) Filed: Oct. 26, 2021

(65) Prior Publication Data

US 2022/0293885 A1    Sep. 15, 2022

(30) Foreign Application Priority Data

Mar. 10, 2021    (CN) .......................... 202120509851.4

(51) Int. Cl.
*H10K 50/84*     (2023.01)
*H10K 50/844*    (2023.01)

(52) U.S. Cl.
CPC .................................. *H10K 50/844* (2023.02)

(58) Field of Classification Search
CPC .................. H10K 50/844; H10K 50/82; H05K 2201/09909
See application file for complete search history.

(56) References Cited

U.S. PATENT DOCUMENTS

| | | | | |
|---|---|---|---|---|
| 2012/0142132 A1* | 6/2012 | Adachi | ............. | H01L 27/14625 257/E33.012 |
| 2017/0141164 A1* | 5/2017 | Xiong | .................. | H10K 50/805 |
| 2019/0181362 A1* | 6/2019 | Tian | ........................ | B32B 3/266 |

FOREIGN PATENT DOCUMENTS

| | | | | | |
|---|---|---|---|---|---|
| CN | 109860253 A | * | 6/2019 | ............... | G09F 9/30 |
| CN | 110085118 A | * | 8/2019 | ............... | G09F 9/00 |
| CN | 110137217 A | * | 8/2019 | ........... | G06F 1/1652 |
| KR | 20170025942 A | * | 3/2017 | | |

* cited by examiner

*Primary Examiner* — Ida M Soward
(74) *Attorney, Agent, or Firm* — IPro, PLLC

(57) ABSTRACT

Disclosed is an OLED display panel including a display region, a packaging region and a cutting region disposed. The packaging region is provided with a plurality of modification stripes and includes a first region and a second region. The modification stripes include lyophilic stripes and lyophobic stripes disposed at intervals, and any two adjacent modification stripes include one lyophilic stripe and one lyophobic stripe. In the first region: width ranges of the lyophilic stripes and the lyophobic stripes are both 1-100 nm; and in the second region: a width range of the lyophilic stripes is 1-100 nm, a width range of the lyophobic stripes is 200-1000 nm, and a width of the lyophobic stripes in the second region gradually increases in a direction from the display region to the cutting region.

20 Claims, 6 Drawing Sheets

OLED DISPLAY PANEL INCLUDING LYOPHILIC AND LYOPHOBIC MODIFICATION STRIPES

CROSS REFERENCE TO RELATED APPLICATIONS

This disclosure is based on and claims priority under 35 U.S.C 119 to Chinese Patent Application No. 202120509851.4, filed on Mar. 10, 2021, in the China National Intellectual Property Administration. The entire disclosure of the above application is incorporated herein by reference.

FIELD

The disclosure relates to the technical field of inkjet printing, in particular to an OLED display panel.

BACKGROUND

A special-shaped OLED display panel is a usually display panel with its display region being not a rectangular.

At present, special-shaped screens prepared by an inkjet printing technology in a production line are all subjected to a rectangular film forming process, which means that an entire substrate, including a packaging region, is printed. Then the special-shaped screens are obtained by cutting the devices.

However, organic films are easily exposed at cutting edges of the special-shaped screens, and water vapor and oxygen will invade from the organic films and enter the display regions, causing organic materials in the display regions to be corroded and defective.

SUMMARY

The disclosure provides an OLED display panel, a display apparatus, and display equipment.

In a first aspect, an OLED display panel includes a display region, a packaging region and a cutting region disposed in that order. A plurality of modification stripes are provided in the packaging region. The packaging region includes a first region and a second region, the first region being between the display region and the second region, and the second region being between the first region and the cutting region. The modification stripes include lyophilic stripes and lyophobic stripes disposed at intervals, and any two adjacent modification stripes include one lyophilic stripe and one lyophobic stripe. In the first region: a width range of the lyophilic stripes and a width range of the lyophobic stripes are both 1-100 nm; and in the second region: a width range of the lyophilic stripes is 1-100 nm, a width range of the lyophobic stripes is 200-1000 nm, and a width of the lyophobic stripes in the second region gradually increases in a direction from the display region to the cutting region.

In a second aspect, a display apparatus is provided. The display apparatus includes an OLED display panel. The OLED display panel includes a display region, a packaging region and a cutting region disposed in that order. A plurality of modification stripes are provided in the packaging region. The packaging region includes a first region and a second region, the first region being between the display region and the second region, and the second region being between the first region and the cutting region. The modification stripes include lyophilic stripes and lyophobic stripes disposed at intervals, and any two adjacent modification stripes include one lyophilic stripe and one lyophobic stripe. In the first region: a width range of the lyophilic stripes and a width range of the lyophobic stripes are both 1-100 nm; and in the second region: a width range of the lyophilic stripes is 1-100 nm, a width range of the lyophobic stripes is 200-1000 nm, and a width of the lyophobic stripes in the second region gradually increases in a direction from the display region to the cutting region.

In a third aspect, a display equipment is provided. The display equipment includes the above-mentioned display apparatus.

DETAILED DESCRIPTION OF THE EMBODIMENTS

The technical solutions of the embodiments of the disclosure will be described clearly and completely with reference to the accompanying drawings in the embodiments of the disclosure. Apparently, the described embodiments are only some, but not all, embodiments of the disclosure. Based on the embodiments in the disclosure, all other embodiments attainable by those ordinarily skilled in the art without any inventive effort fall within the protection scope of the disclosure.

Figure 1:
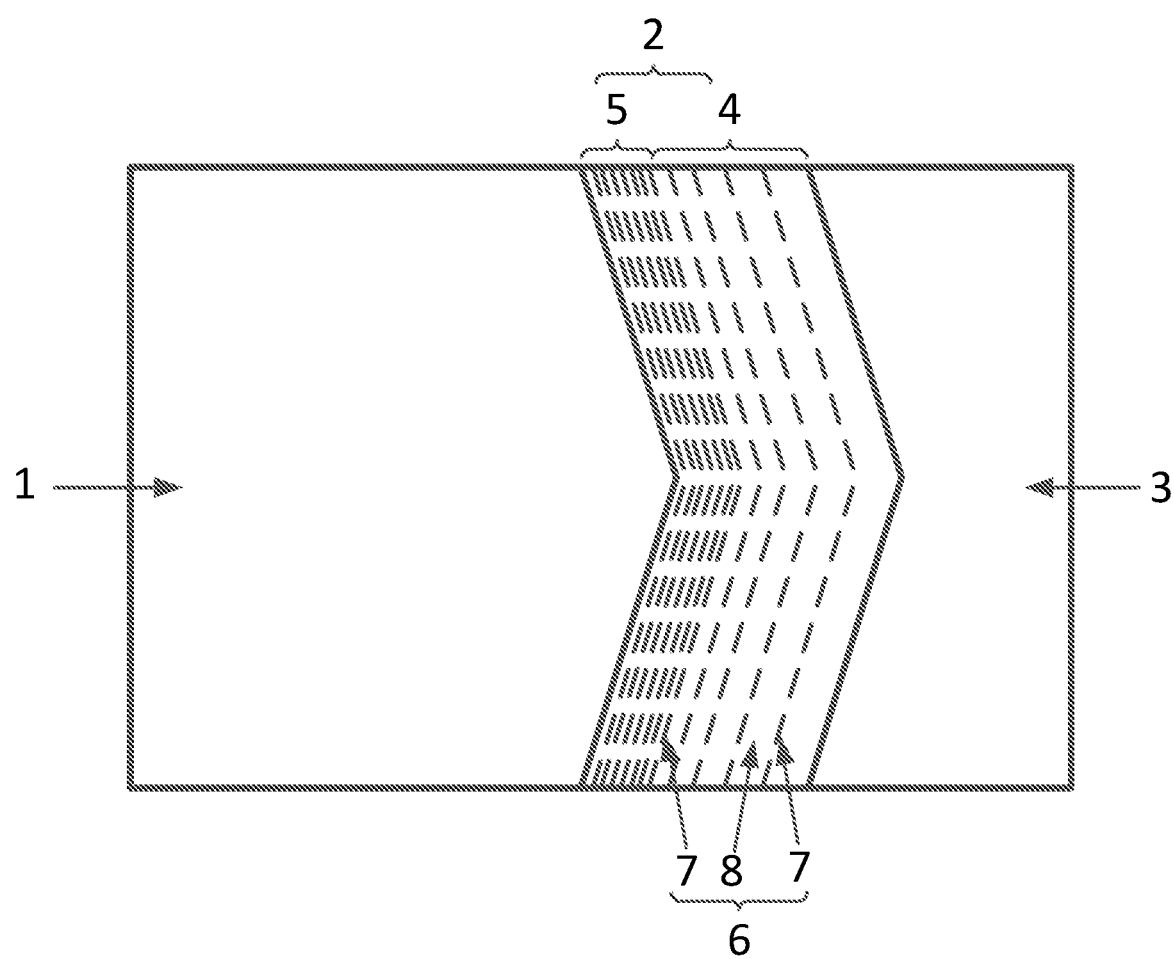
FIG. 1 is a schematic structural diagram of an OLED display panel according to some embodiments of the disclosure.

An OLED display panel provided by embodiments of the disclosure is suitable for special-shaped printing. FIG. 1 is a schematic structural diagram of an OLED display panel suitable for special-shaped according to some embodiments of the disclosure. As shown in FIG. 1, the OLED display panel includes a display region 1, a packaging region 2 and a cutting region 3 arranged in that order. A plurality of modification stripes 6 are provided in the packaging region 2. The packaging region 2 includes a first region 5 and a second region 4, the first region 5 is between the display region 1 and the second region 4, and the second region 4 is between the first region 5 and the cutting region 3. The modification stripes 6 include lyophilic stripes 7 and lyophobic stripes 8 disposed at intervals, and any two adjacent modification stripes 6 include one lyophilic stripe 7 and one lyophobic stripe 8. In the first region 5: width ranges of the lyophilic stripes 7 and the lyophobic stripes 8 are both 1-100 nm; and in the second region 4: a width range of the lyophilic stripes 7 is 1-100 nm, a width range of the lyophobic stripes 8 is 200-1000 nm, and a width of the lyophobic stripes 8 in the second region 4 gradually increases in a direction from the display region 1 to the cutting region 3.

In the OLED display panel provided by the present embodiments, the device is prepared first by an inkjet printing, and then goes through a packaging process. Further, an exposed organic film is peeled off from the second region 4 of the packaging region 2, and finally cutting is performed.

The width of the lyophobic stripes in the second region gradually increases in the direction from the display region to the cutting region, which facilitate peeling off the organic film clearly. As such, the organic film may be prevented from being exposed at a cutting edge of the panel, and accordingly water vapor and oxygen are prevented from entering the display region through the organic film, organic materials in the display region are prevented from being corroded, and thus the yield of the panel is improved. In addition, since the lyophilic stripes and the lyophobic stripes in the first region have the equal width and the width ranges of the lyophilic stripes and the lyophobic stripes are both 1-100 nm, which are almost the same, an organic film that is not exposed at the cutting edge will not be peeled off at the same time. Thus performance of the OLED panel can be guaranteed.

In some embodiments, in the first region: widths of the lyophilic stripes and the lyophobic stripes are both 100 nm.

As shown in FIG. 1, in some embodiments, the width of the lyophobic stripes 8 in the second region 4 increases gradually in the direction from the display region 1 to the cutting region 3.

In the present embodiment, since the width of the lyophobic stripes in the second region increases in the direction from the display region to the cutting region, the organic film exposed at the cutting edge of the panel is more easily peeled off during peeling, and the work efficiency is improved.

As shown in FIG. 1, in some embodiments, an area ratio of the second region 4 in the packaging region 2 ranges from 50% to 80%.

In the present embodiments, an area of the second region 4 is set to be larger than that of the first region 5, which facilitate peeling off the organic film exposed at the cutting edge clearly. An area of the first region 5 is set to be not too small, thus the organic film that is not exposed at the cutting edge from is prevented from being peeled off together. In example embodiments, the area ratio of the second region 4 in the packaging region 2 may optionally range from 50% to 80%.

Figure 4:
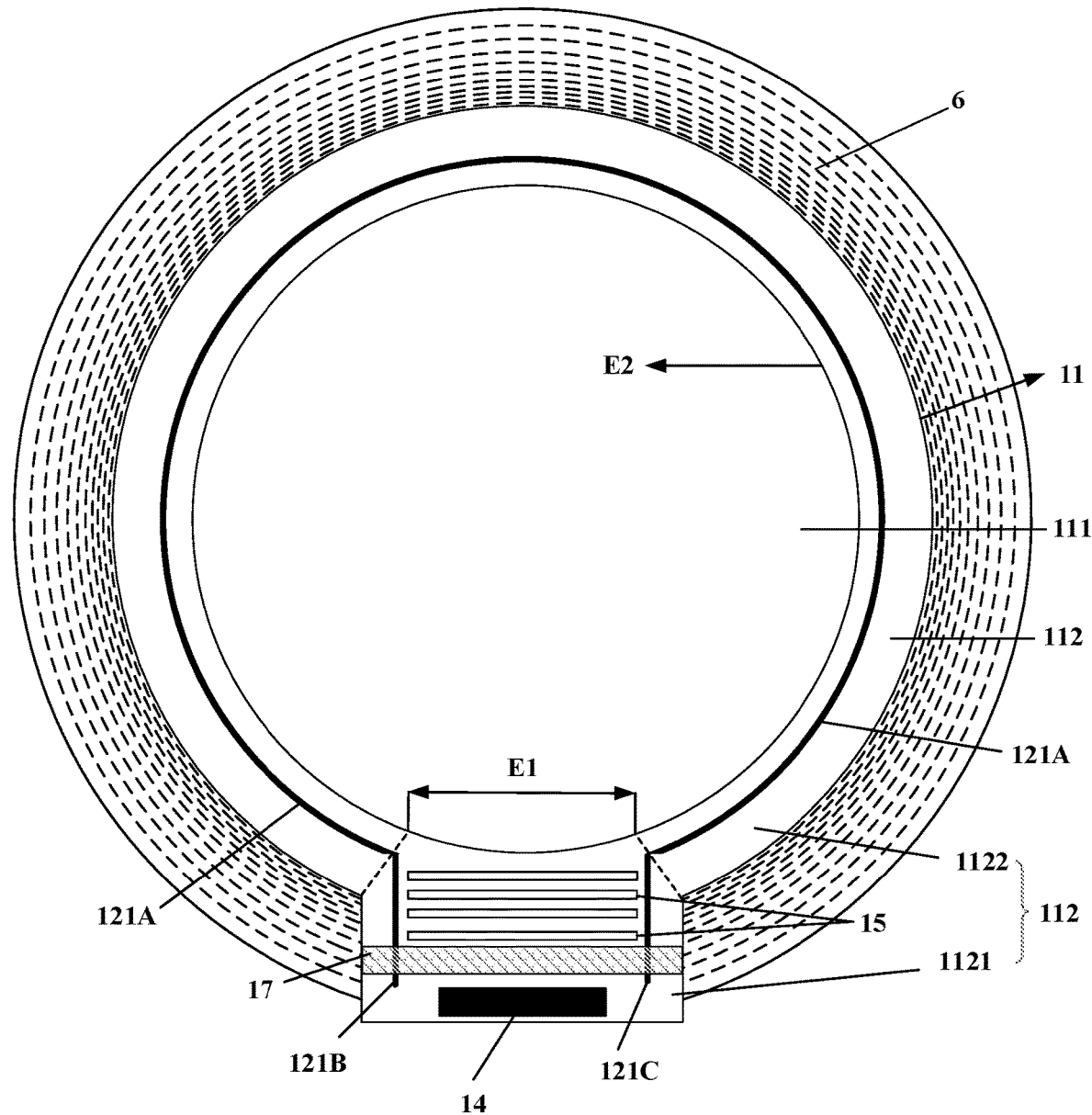
FIG. 4 shows a schematic top view of another display panel according to some embodiments of the disclosure.

In the display panel according to the embodiments of the disclosure, the display region 1 is schematically shown as a substantially rectangular shape. It should be understood that the embodiments of the disclosure is not limited thereto. For example, the display region 1 may substantially be in an irregular shape such as a circle or a heart shape. In the display panel shown in FIG. 1, the modification stripes 6 are bent around the display region 1 to form an obtuse angle facing the display region 1. It should be understood that a shape of the modification stripes 6 is adaptively designed according to the shape of the display region. For example, if the display region is circular, the modification stripes 6 extend in an arc shape along the display region, as shown in FIG. 4.

Hereinafter, the display panel provided by the embodiment of the disclosure will be further described by taking the display region as a circle.

Figure 2:
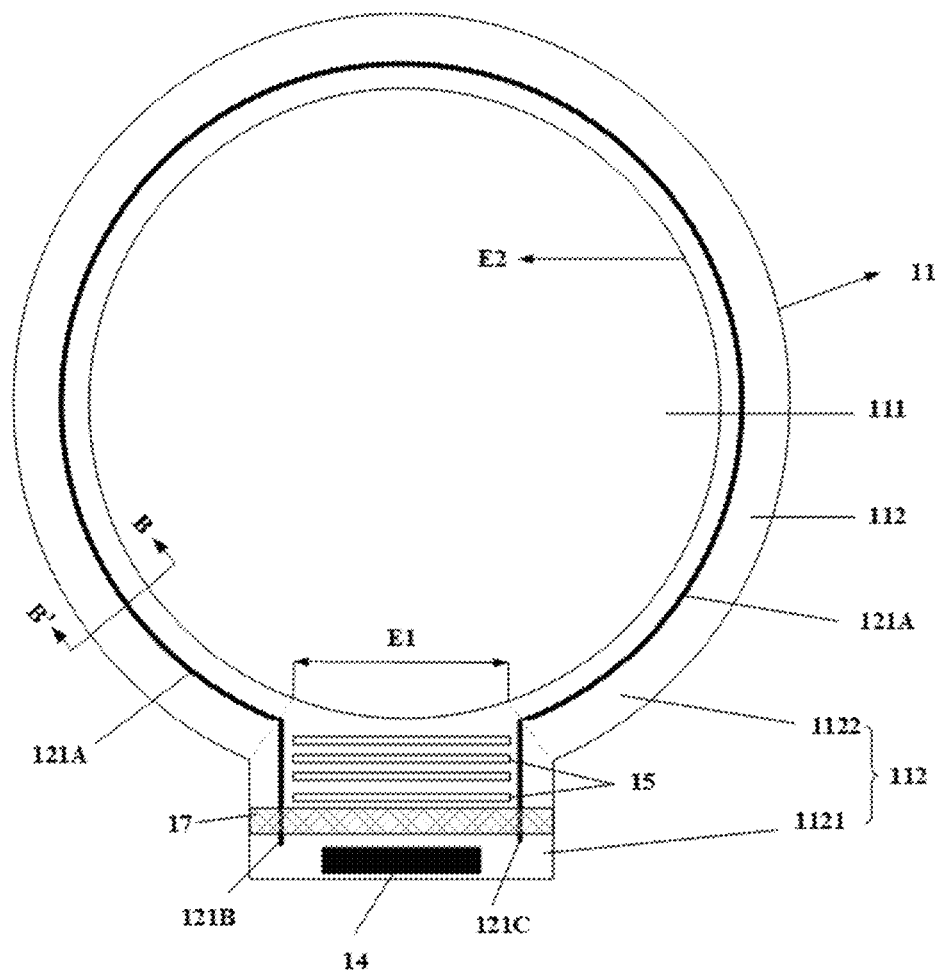
FIG. 2 shows a schematic top view of a display panel according to some embodiments of the disclosure.

FIG. 2 shows a schematic top view of a display panel according to other embodiments of the disclosure. In the embodiment shown in FIG. 2, the display region of the shown display panel is circular.

As shown in FIG. 2, the display panel further includes a peripheral region 112. The peripheral region surrounds the display region and is located between the display region and the packaging region, as shown in FIG. 4.

The display panel includes: a base substrate 11, an isolation component 12, a cathode 13 and a packaging layer 16.

The isolation component 12 is located in the peripheral region 112. The isolation component 12 includes at least one isolation portion 121 at least partially surrounding the display region 111.

Each isolation portion 121 includes a first isolation layer 1211 and a second isolation layer 1212 sequentially stacked on the base substrate 11. A first orthographic projection 1211' of the first isolation layer 1211 on the base substrate 11 is located within a second orthographic projection 1212' of the second isolation layer 1212 on the base substrate 11. In some embodiments, a material of the first isolation layer 1211 includes aluminum, and a material of the second isolation layer 1212 includes titanium.

Figure 3A:
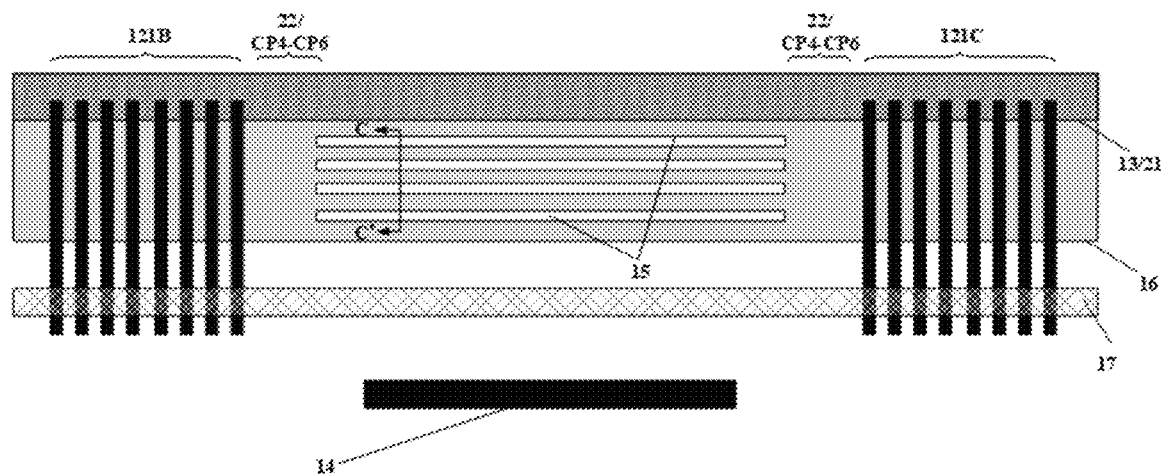
FIG. 3A is a partially enlarged schematic diagram of a bonding region shown in FIG. 2.
Figure 3B:
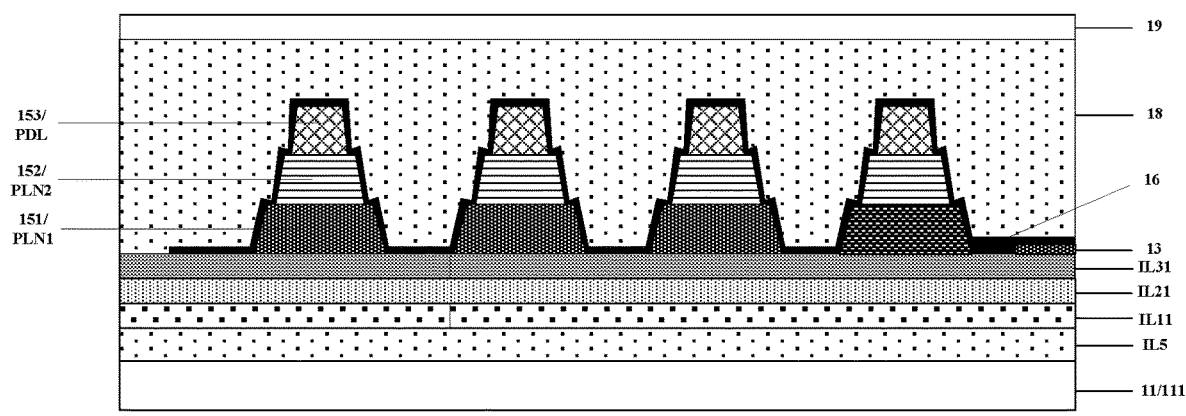
FIG. 3B is a sectional view of the display panel in the bonding region taken along line C-C' shown in FIG. 3A.
Figure 3C:
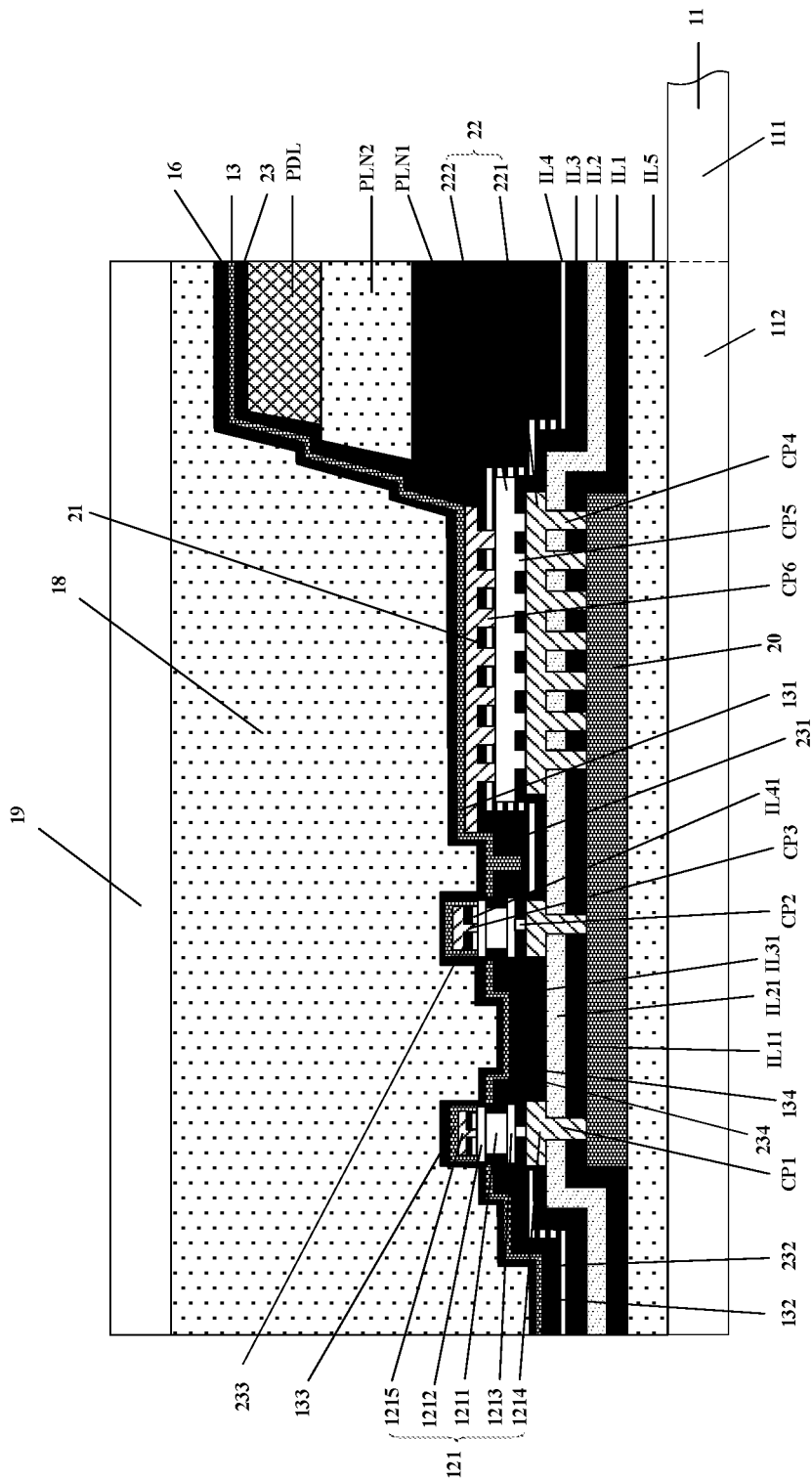
FIG. 3C shows a sectional view of the display panel taken along line B-B' shown in FIG. 2.

Continuing to refer to FIG. 3C, the cathode 13 includes a first cathode portion 131 and a second cathode portion 132 spaced from the first cathode portion 131. Here, the first cathode portion 131 is located at one side, close to the display region 111, of the isolation component 12, and the second cathode portion 132 is located at one side, away from the display region 111, of the isolation component 12. In other words, two portions, located at both sides of the isolation component 12, of the cathode 13 are separate. In some embodiments, the first cathode portion 131 extends from the display region 111 to the peripheral region 112, and a plurality of sub-pixels P share the first cathode portion 131.

Figure 3D:
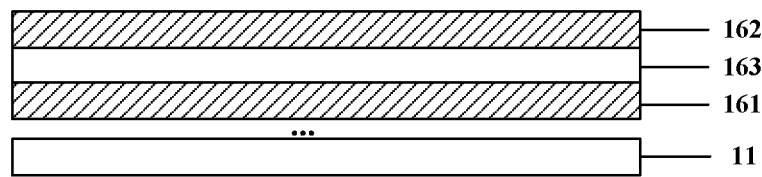
FIG. 3D shows a sectional view of the packaging layer according to some embodiments of the disclosure.

Referring to FIG. 3C, the packaging layer 16 is disposed on one side, away from the base substrate 11, of the cathode 13. Referring to FIG. 3D, the packaging layer 16 includes a first inorganic layer 161, a second inorganic layer 162, and an organic layer 163 between the first inorganic layer 161 and the second inorganic layer 162. An edge of an orthographic projection of the first inorganic layer 161 on the base substrate 11, an edge of an orthographic projection of the organic layer 163 on the base substrate 11 and an edge of an orthographic projection of the second inorganic layer 162 on the base substrate 11 overlap. It should be understood that the "overlap" here refers to complete overlap. In other words, the orthographic projections of the first inorganic layer 161, the second inorganic layer 162, and the organic layer 163 on the base substrate 11 are the same.

The peripheral region includes a bonding region 1121 and a non-bonding region 1122. That is, the peripheral region is divided into the bonding region and the non-bonding region. Here, the bonding region 1121 surrounds a first edge E1 of edges of the display region 111, and the non-bonding region 1122 surrounds a second edge E2, except for the first edge E1, of the edges of the display region 111. Each isolation portion 121 includes a first isolation portion 121A located in the non-bonding region 1122 and surrounding the second edge E2. It should be noted that FIG. 2 only schematically shows one isolation portion 121, and structures of other isolation portions 121 may refer to that shown in FIG. 2.

It should be understood that the bonding region 1121 is configured to establish an electrical connection with an external circuit (for example, a circuit board, an integrated circuit chip, etc.) in a bonding manner. The bonding region 1121 may be provided with a bonding pad 14 and other signal lines. The external circuit may provide a signal to the display panel via the bonding pad 114.

It should be understood that a boundary between the bonding region 1121 and the non-bonding region 1122 shown in FIG. 2 is only illustrative. Those skilled in the art understand that a frame size of the bonding region 1121 is generally larger than a frame size of the non-bonding region 1122, that is, a minimum distance between the edge, away from the display region 111, of the bonding region 1121 and the edge of the display region 111 is greater than that between the edge, away from the display region 111, of the non-bonding region 1122 and the edge of the display region 111. Therefore, according to the frame size, it may be determined that a part of the peripheral region 112 is the bonding region 1121, and the remaining part is the non-bonding region 1122.

In the above-mentioned embodiments, each first isolation portion 121A disposed around the second edge E2 may block water vapor and oxygen from entering the display region 111 via the cathode 13, so that the display effect of the display panel can be improved.

In some embodiments, referring to FIG. 2, each isolation portion 121 further includes a second isolation portion 121B and a third isolation portion 121C located in the bonding region 1121. The second isolation portions 121B are connected with one end of each of the first isolation portion 121A, and the third isolation portions 121C are connected with the other end of each of the first isolation portion 121A. Here, the third isolation portions 121C and the second isolation portions 121B both extend in a direction of ascending distance from the display region 111.

It should be understood that a starting point and an end point of the extension of the first isolation portions 121A around the second edge E2 are two ends of the first isolation portions 121A.

Extension directions of the second isolation portions 121B and the third isolation portions 121C shown in FIG. 2 are the same. In some embodiments, the directions may be not same.

In the above-mentioned embodiments, each isolation portion 121 further includes the second isolation portion 121B and the third isolation portion 121C located in the peripheral region, so that the water vapor and the oxygen may be more effectively blocked from entering the display region 111 via the cathode 13, and the display effect of the display panel may be further improved.

FIG. 3A is a partially enlarged schematic diagram of a bonding region shown in FIG. 2. FIG. 3B is a schematic sectional view of the structure in the bonding region taken along C-C' shown in FIG. 3A.

In some embodiments, referring to FIG. 3A, FIG. 3C and FIG. 2, the display panel further includes a bonding pad 14 and at least one cofferdam 15.

In some embodiments, the display panel includes a plurality of cofferdams 15 which are arranged at intervals along a direction from the first edge E1 to the bonding pad 14. As shown in FIG. 3B, for example, each cofferdam 15 may include a first layer 151, a second layer 152, and a third layer 153 sequentially disposed on a third insulating layer IL3. For example, each first layer 151 may be in the same layer as a first planarization layer PLN1, each second layer 152 may be in the same layer as a second planarization layer PLN2, and each third layer 153 may be in the same layer as a pixel defining layer PDL.

Both the bonding pad 14 and the cofferdams 15 are located in the bonding region 1121. The cofferdams 15 are located between the first edge E1 and the bonding pad 14, and extend in a direction from the second isolation portions 121B to the third isolation portions 121C.

The packaging layer 16 is disposed on the cathode 13 and the side, away from the base substrate 11, of the at least one cofferdam 15. Here, an orthographic projection of the bonding pad 14 on the base substrate 11 is located outside an orthographic projection of the packaging layer 16 on the base substrate 11, and an orthographic projection of each cofferdam 15 on the base substrate 11 is located within the orthographic projection of the packaging layer 16 on the base substrate 11. In other words, the bonding pad 14 is not covered with the packaging layer 16, and each cofferdam 15 is covered with the packaging layer.

In the above-mentioned embodiments, the cofferdams 15 make an extending path of the packaging layer 16 longer. In this way, the water vapor and the oxygen may be more effectively blocked from entering the display region 111 via the packaging layer 16, and the packaging effect of the packaging layer is improved, thereby further improving the display effect of the display panel.

In some embodiments, referring to FIG. 3A, the cofferdams 15 are located between the cathode 13 and the bonding pad 14, so that a possibility of the water vapor and the oxygen entering the cathode 13 may be further reduced, and accordingly the display effect of the display panel is further improved.

In some embodiments, referring to FIG. 2, the display panel further includes a colloid portion 17, a colloid layer 18, and a cover plate 19. As shown in FIG. 2, the colloid portion 17 is located in the bonding region 1121 and between the cofferdams 15 and the bonding pad 14. As shown in FIG. 3C, the colloid layer 18 is disposed on one side, away from the base substrate 11, of the packaging layer 16, and the cover plate 19 is disposed on one side, away from the base substrate 11, of the colloid layer 18. The colloid portion 17 may reduce the impact on the bonding pad 14 when a colloid material is filled to form the colloid layer 18, so that the reliability of the display panel is improved.

It should be understood that the display panels provided by different embodiments of the disclosure may be combined.

Embodiments of the disclosure further provide a display apparatus, including any of the above-mentioned OLED display panels.

In the present embodiment, the display apparatus may be a display, and the beneficial effects of the display apparatus are the same as those of the above-mentioned OLED display panels, which will not be repeated.

Embodiments of the disclosure further provide a display equipment, including the above-mentioned display apparatus.

In the present embodiments, the display equipment may be a computer, and the beneficial effects of the display equipment are the same as those of the above-mentioned display apparatus, which will not be repeated.

It will be apparent to those skilled in the art that various modifications and variations can be made to the present application without departing from the spirit or scope of the present application. Thus, if these modifications and variations of the present application fall within the scope of the claims of the present application and their equivalent art, the present application also intends to include these modifications and variations.

The invention claimed is:

1. An Organic Light Emitting Diode (OLED) display panel, comprising:
   a display region, a packaging region and a cutting region arranged in that order, wherein the packaging region is provided with a plurality of modification stripes;
   the packaging region comprises a first region and a second region, the first region is located between the display region and the second region, and the second region is located between the first region and the cutting region;
the plurality of modification stripes comprise lyophilic stripes and lyophobic stripes disposed at intervals, and any two adjacent modification stripes of the plurality of modification stripes comprise one lyophilic stripe and one lyophobic stripe;
in the first region: width ranges of the lyophilic stripes and the lyophobic stripes are both 1-100 nm; and
in the second region: a width range of the lyophilic stripes is 1-100 nm, a width range of the lyophobic stripes is 200-1000 nm, and a width of the lyophobic stripes in the second region gradually increases in a direction from the display region to the cutting region.

2. The OLED display panel according to claim 1, wherein in the first region: widths of the lyophilic stripes and the lyophobic stripes are both 100 nm.

3. The OLED display panel according to claim 1, wherein the width of the lyophobic stripes in the second region increases gradually in the direction from the display region to the cutting region.

4. The OLED display panel according to claim 3, wherein an area ratio of the second region in the packaging region ranges from 50% to 80%.

5. The OLED display panel according to claim 1, further comprising a peripheral region surrounding the display region and located between the display region and the packaging region, wherein the display panel comprises:
a base substrate;
an isolation component in the peripheral region, comprising at least one isolation portion at least partially surrounding the display region, each isolation portion comprising a first isolation layer and a second isolation layer sequentially stacked on the base substrate, and a first orthographic projection of the first isolation layer on the base substrate being located within a second orthographic projection of the second isolation layer on the base substrate;
a cathode, comprising:
a first cathode portion, located at a side, close to the display region, of the isolation component, and
a second cathode portion, located at a side, away from the display region, of the isolation component, and spaced from the first cathode portion;
and
a packaging layer, disposed on a side, away from the base substrate, of the cathode, and comprising a first inorganic layer, a second inorganic layer, and an organic layer located between the first inorganic layer and the second inorganic layer;
wherein an edge of an orthographic projection of the first inorganic layer on the base substrate, an edge of an orthographic projection of the organic layer on the base substrate, and an edge of an orthographic projection of the second inorganic layer on the base substrate overlap.

6. The display panel according to claim 5, wherein
the peripheral region comprises a bonding region and a non-bonding region, the bonding region surrounds a first edge of edges of the display region, and the non-bonding region surrounds a second edge, except for the first edge, of the edges of the display region; and
each isolation portion comprises a first isolation portion located in the non-bonding region and surrounding the second edge.

7. The display panel according to claim 6, wherein each isolation portion comprises:
a second isolation portion, located in the bonding region and connected with one end of the first isolation portion; and
a third isolation portion, located in the bonding region and connected with the other end of the first isolation portion, both the third isolation portion and the second isolation portion extending along a direction of ascending distance from the display region.

8. The display panel according to claim 7, comprising:
a bonding pad in the bonding region; and
at least one cofferdam in the bonding region and between the first edge and the bonding pad, the at least one cofferdam extending in a direction from the second isolation portion to the third isolation portion, wherein the packaging layer is disposed on a side, away from the base substrate, of the at least one cofferdam;
wherein an orthographic projection of the bonding pad on the base substrate is located outside an orthographic projection of the packaging layer on the base substrate, and
an orthographic projection of the at least one cofferdam on the base substrate is located within the orthographic projection of the packaging layer on the base substrate.

9. The display panel according to claim 8, wherein the at least one cofferdam is located between the cathode and the bonding pad.

10. The display panel according to claim 8, wherein the at least one cofferdam comprises a plurality of cofferdams, and the plurality of cofferdams are arranged at intervals in a direction from the first edge to the bonding pad.

11. The display panel according to claim 8, comprising:
a colloid portion in the bonding region and between the at least one cofferdam and the bonding pad;
a colloid layer, disposed on a side, away from the base substrate, of the packaging layer; and
a cover plate, disposed on a side, away from the base substrate, of the colloid layer.

12. A display apparatus, comprising an OLED display panel, wherein the OLED display panel comprises a display region, a packaging region and a cutting region in that order, wherein the packaging region is provided with a plurality of modification stripes;
the packaging region comprises a first region and a second region, the first region is located between the display region and the second region, and the second region is located between the first region and the cutting region;
the plurality of modification stripes comprise lyophilic stripes and lyophobic stripes disposed at intervals, and any two adjacent modification stripes of the plurality of modification stripes comprise one lyophilic stripe and one lyophobic stripe;
in the first region: width ranges of the lyophilic stripes and the lyophobic stripes are both 1-100 nm; and
in the second region: a width range of the lyophilic stripes is 1-100 nm, a width range of the lyophobic stripes is 200-1000 nm, and a width of the lyophobic stripes in the second region gradually increases in a direction from the display region to the cutting region.

13. The display apparatus according to claim 12, wherein in the first region: widths of the lyophilic stripes and the lyophobic stripes are both 100 nm.

14. The display apparatus according to claim 12, wherein the width of the lyophobic stripes in the second region increases gradually in the direction from the display region to the cutting region.

15. The display apparatus according to claim 14, wherein an area ratio of the second region in the packaging region ranges from 50% to 80%.

16. The display apparatus according to claim 12, wherein the display panel further comprises a peripheral region surrounding the display region and located between the display region and the packaging region, and the display panel comprises:
a base substrate;
an isolation component in the peripheral region, comprising at least one isolation portion at least partially surrounding the display region, each isolation portion comprising a first isolation layer and a second isolation layer sequentially stacked on the base substrate, and a first orthographic projection of the first isolation layer on the base substrate being located within a second orthographic projection of the second isolation layer on the base substrate;
a cathode, comprising:
a first cathode portion, located at a side, close to the display region, of the isolation component, and
a second cathode portion, located at a side, away from the display region, of the isolation component, and spaced from the first cathode portion;
and
a packaging layer, disposed on a side, away from the base substrate, of the cathode, and comprising a first inorganic layer, a second inorganic layer, and an organic layer located between the first inorganic layer and the second inorganic layer;
wherein an edge of an orthographic projection of the first inorganic layer on the base substrate, an edge of an orthographic projection of the organic layer on the base substrate, and an edge of an orthographic projection of the second inorganic layer on the base substrate overlap.

17. The display apparatus according to claim 16, wherein the peripheral region comprises a bonding region and a non-bonding region, the bonding region surrounds a first edge of edges of the display region, and the non-bonding region surrounds a second edge, except for the first edge, of the edges of the display region; and
each isolation portion comprises a first isolation portion located in the non-bonding region and surrounding the second edge.

18. The display apparatus according to claim 17, wherein each isolation portion further comprises:
a second isolation portion, located in the bonding region and connected with one end of the corresponding first isolation portion; and
a third isolation portion, located in the bonding region and connected with the other end of the corresponding first isolation portion, both the third isolation portions and the second isolation portions extending along a direction of ascending distance from the display region.

19. The display apparatus according to claim 18, further comprising:
a bonding pad in the bonding region; and
at least one cofferdam in the bonding region and between the first edge and the bonding pad, the at least one cofferdam extending in a direction from the second isolation portion to the third isolation portion, wherein
the packaging layer is disposed on a side, away from the base substrate, of the at least one cofferdam;
wherein an orthographic projection of the bonding pad on the base substrate is located outside an orthographic projection of the packaging layer on the base substrate, and
an orthographic projection of the at least one cofferdam on the base substrate is located within the orthographic projection of the packaging layer on the base substrate.

20. A display equipment, comprising the display apparatus according to claim 12.

* * * * *